United States Patent
Kishimoto et al.

(10) Patent No.: US 10,770,672 B2
(45) Date of Patent: Sep. 8, 2020

(54) FLEXIBLE OLED DEVICE, METHOD FOR MANUFACTURING SAME, AND SUPPORT SUBSTRATE

(71) Applicant: SAKAI DISPLAY PRODUCTS CORPORATION, Sakai-shi, Osaka (JP)

(72) Inventors: Katsuhiko Kishimoto, Sakai (JP); Yukiya Nishioka, Sakai (JP)

(73) Assignee: SAKAI DISPLAY PRODUCTS CORPORATION, Sakai-shi, Osaka (JP)

(*) Notice: Subject to any disclaimer, the term of this patent is extended or adjusted under 35 U.S.C. 154(b) by 0 days.

(21) Appl. No.: 16/610,975

(22) PCT Filed: Feb. 27, 2018

(86) PCT No.: PCT/JP2018/007298
§ 371 (c)(1),
(2) Date: Jan. 2, 2020

(87) PCT Pub. No.: WO2019/167130
PCT Pub. Date: Sep. 6, 2019

(65) Prior Publication Data
US 2020/0144528 A1    May 7, 2020

(51) Int. Cl.
| | | |
|---|---|---|
| H01L 51/50 | (2006.01) |
| H01L 27/32 | (2006.01) |
| H01L 51/56 | (2006.01) |
| G09F 9/00 | (2006.01) |
| G09F 9/30 | (2006.01) |

(Continued)

(52) U.S. Cl.
CPC .............. *H01L 51/504* (2013.01); *G09F 9/00* (2013.01); *G09F 9/30* (2013.01); *H01L 27/32* (2013.01);

(Continued)

(58) Field of Classification Search
CPC .... H01L 21/2007; H01L 51/504; H01L 51/56
See application file for complete search history.

(56) References Cited

U.S. PATENT DOCUMENTS

| | | |
|---|---|---|
| 2011/0204361 A1 | 8/2011 | Nishiki et al. |
| 2012/0225221 A1 | 9/2012 | Yamazaki et al. |

(Continued)

FOREIGN PATENT DOCUMENTS

| | | |
|---|---|---|
| JP | 2002-031818 A | 1/2002 |
| JP | 4310784 B2 | 8/2009 |

(Continued)

OTHER PUBLICATIONS

Nie et al. "Structural and electrical properties of tantalum nitride thin films fabricated by using reactive radio frequency magnetron sputtering," https://arxiv.org/abs/cond-mat/0305683 (Year: 2003).*

*Primary Examiner* — Matthew L Reames
(74) *Attorney, Agent, or Firm* — ScienBiziP, P.C.

(57) ABSTRACT

According to a method for producing a flexible OLED device of the present disclosure, a multilayer stack (100) is provided, the multilayer stack including a base (10), a functional layer region (20) which includes a TFT layer and an OLED layer, a flexible film (30) provided between the base and the functional layer region and supporting the functional layer region, and a release layer (12) provided between the flexible film and the base and bound to the base. The release layer is irradiated with lift-off light (216) transmitted through the base, whereby the flexible film is delaminated from the release layer. The release layer is made of a polycrystalline of tantalum nitride.

7 Claims, 11 Drawing Sheets

(51) Int. Cl.
  *H05B 33/02* (2006.01)
  *H05B 33/10* (2006.01)
(52) U.S. Cl.
  CPC .......... *H01L 27/3244* (2013.01); *H01L 51/50* (2013.01); *H01L 51/56* (2013.01); *H05B 33/02* (2013.01); *H05B 33/10* (2013.01); *H01L 2251/301* (2013.01); *H01L 2251/5338* (2013.01); *H01L 2251/56* (2013.01)

(56) References Cited

U.S. PATENT DOCUMENTS

| | | |
|---|---|---|
| 2015/0069358 A1 | 3/2015 | Chida et al. |
| 2017/0154947 A1 | 6/2017 | Nakamura |

FOREIGN PATENT DOCUMENTS

| | | |
|---|---|---|
| JP | 4310788 B2 | 8/2009 |
| JP | 4348217 B2 | 10/2009 |
| JP | 2009-256784 A | 11/2009 |
| JP | 2011-222421 A | 11/2011 |
| JP | 2012-238445 A | 12/2012 |
| JP | 2013-077410 A | 4/2013 |
| JP | 2013-117642 A | 6/2013 |
| JP | 2013-145808 A | 7/2013 |
| JP | 2013-182787 A | 9/2013 |
| JP | 2015-109258 A | 6/2015 |
| JP | 2017-211630 A | 11/2017 |
| WO | 2009/037797 A1 | 3/2009 |

\* cited by examiner

FLEXIBLE OLED DEVICE, METHOD FOR MANUFACTURING SAME, AND SUPPORT SUBSTRATE

TECHNICAL FIELD

The present disclosure relates to a flexible OLED device, a method for producing the flexible OLED device, and a supporting substrate.

BACKGROUND ART

A typical example of the flexible display includes a film which is made of a synthetic resin such as polyimide (hereinafter, referred to as "plastic film"), and elements supported by the plastic film, such as TFTs (Thin Film Transistors) and OLEDs (Organic Light Emitting Diodes). The plastic film functions as a flexible substrate. The flexible display is encapsulated with a gas barrier film (encapsulation film) because an organic semiconductor layer which is a constituent of the OLED is likely to deteriorate due to water vapor.

Production of the flexible display can be carried out using a glass base on which a plastic film is formed over the upper surface. The glass base functions as a support (carrier) for keeping the shape of the plastic film flat during the production process. Elements such as TFTs and OLEDs, a gas barrier film, and the other constituents are formed on the plastic film, whereby the structure of a flexible OLED device is realized while it is supported by the glass base. Thereafter, the flexible OLED device is delaminated from the glass base and gains flexibility. The entirety of a portion in which elements such as TFTs and OLEDs are arrayed can be referred to as "functional layer region".

Patent Document No. 1 discloses the method of irradiating the interface between a flexible substrate and a glass base with ultraviolet laser light (lift-off light) in order to delaminate from the glass base the flexible substrate with OLED devices provided thereon. According to the method disclosed in Patent Document No. 1, an amorphous silicon layer is provided between the flexible substrate and the glass base. The irradiation with the ultraviolet laser light causes generation of hydrogen from the amorphous silicon layer and causes the flexible substrate to be delaminated from the glass base.

CITATION LIST

Patent Literature

Patent Document No. 1: WO 2009/037797

SUMMARY OF INVENTION

Technical Problem

Since conventional plastic films absorb ultraviolet light, the influence of lift-off light irradiation on TFT elements and OLED devices has not been particularly considered. However, according to research by the present inventors, there is a probability that ultraviolet laser light used in the delamination step will deteriorate TFT elements and OLED devices.

The present disclosure provides a flexible OLED device, a method for producing the flexible OLED device, and a supporting substrate, which are capable of solving the above-described problems.

Solution to Problem

A flexible OLED device production method of the present disclosure includes, in an exemplary embodiment, providing a multilayer stack, the multilayer stack including a base, a functional layer region which includes a TFT layer and an OLED layer, a flexible film provided between the base and the functional layer region and supporting the functional layer region, and a release layer provided between the flexible film and the base and bound to the base; and irradiating the release layer with ultraviolet laser light transmitted through the base, thereby delaminating the flexible film from the release layer. The release layer is made of a polycrystalline of tantalum nitride.

In one embodiment, a molar fraction of nitrogen contained in the tantalum nitride is higher than a molar fraction of tantalum contained in the tantalum nitride.

In one embodiment, a surface of the release layer has an irregularity pattern, and a rear surface of the flexible film has a pattern transferred from the irregularity pattern at the surface of the release layer.

In one embodiment, a thickness of the release layer is not less than 50 nm and not more than 500 nm.

In one embodiment, a thickness of the flexible film is not less than 5 μm and not more than 20 μm.

In one embodiment, a wavelength of the ultraviolet laser light is not less than 300 nm and not more than 360 nm.

In one embodiment, providing the multilayer stack includes sputtering a tantalum target in a nitrogen-containing gas atmosphere, thereby forming a polycrystalline of tantalum nitride on the base, and forming the flexible film on the polycrystalline of tantalum nitride.

A flexible OLED device of the present disclosure includes, in an exemplary embodiment, a functional layer region which includes a TFT layer and an OLED layer; and a flexible film supporting the functional layer region, wherein a rear surface of the flexible film has an irregularity pattern.

In one embodiment, irregularities of the irregularity pattern have such a shape and size that visible light is diffuse-reflected by the irregularities.

In one embodiment, a thickness of the flexible film is not less than 5 μm and not more than 20 μm, and the flexible OLED device further includes a support film adhered to the rear surface of the flexible film.

A supporting substrate of the present disclosure is, in an exemplary embodiment, a supporting substrate of a flexible OLED device, including: a release layer which is made of a polycrystalline of tantalum nitride; and a base supporting the release layer, the base being made of a material which is capable of transmitting ultraviolet light.

In one embodiment, a molar fraction of nitrogen contained in the tantalum nitride is higher than a molar fraction of tantalum contained in the tantalum nitride.

In one embodiment, a surface of the release layer has an irregularity pattern.

In one embodiment, the supporting substrate further includes a flexible film which covers the release layer.

In one embodiment, a rear surface of the flexible film has irregularities which are in accordance with the irregularity pattern at the surface of the release layer, and the irregularities have such a shape and size that visible light is diffuse-reflected by the irregularities.

Advantageous Effects of Invention

According to an embodiment of the present invention, a novel flexible OLED device, a novel method for producing the flexible OLED device, and a novel supporting substrate, which are capable of solving the above-described problems, are provided.

DESCRIPTION OF EMBODIMENTS

An embodiment of a method and apparatus for producing a flexible OLED device of the present disclosure is described with reference to the drawings. In the following description, unnecessarily detailed description will be omitted. For example, detailed description of well-known matter and repetitive description of substantially identical elements will be omitted. This is for the purpose of avoiding the following description from being unnecessarily redundant and assisting those skilled in the art to easily understand the description. The present inventors provide the attached drawings and the following description for the purpose of assisting those skilled in the art to fully understand the present disclosure. Providing these drawings and description does not intend to limit the subject matter recited in the claims.

<Multilayer Stack>

Figure 1A:
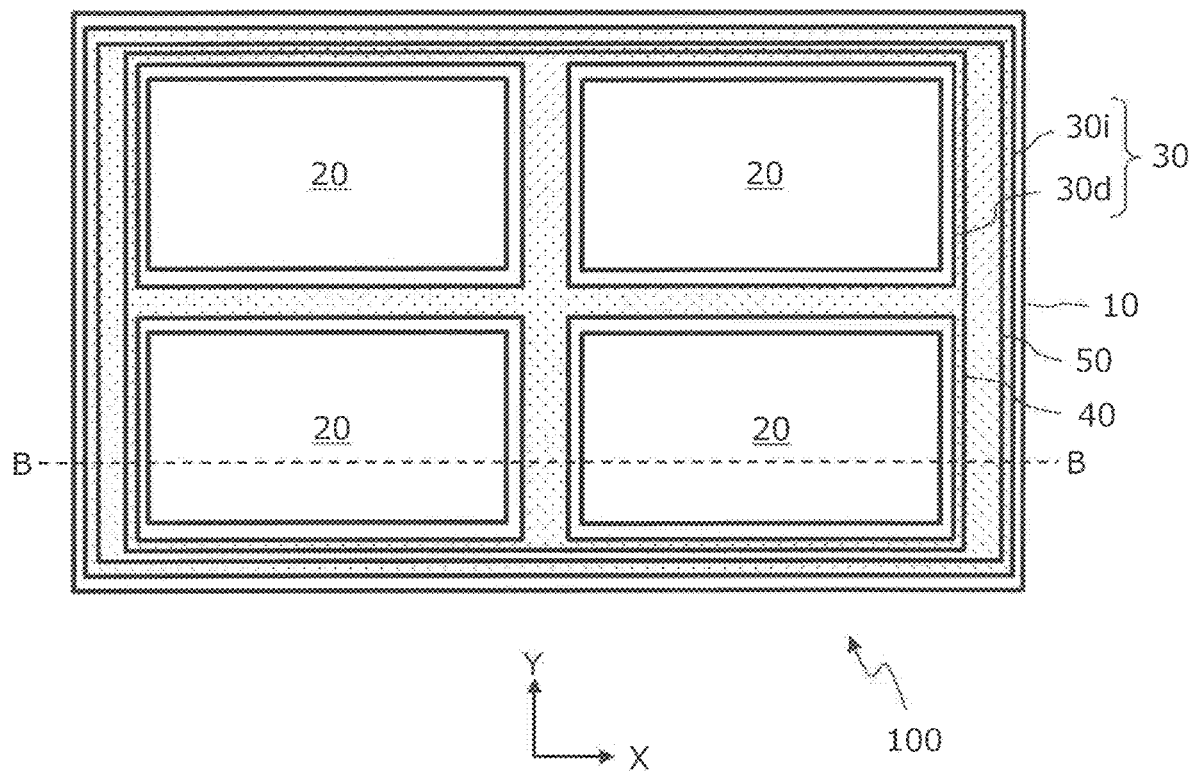
FIG. 1A is a plan view showing a configuration example of a multilayer stack used in a flexible OLED device production method of the present disclosure.
Figure 1B:
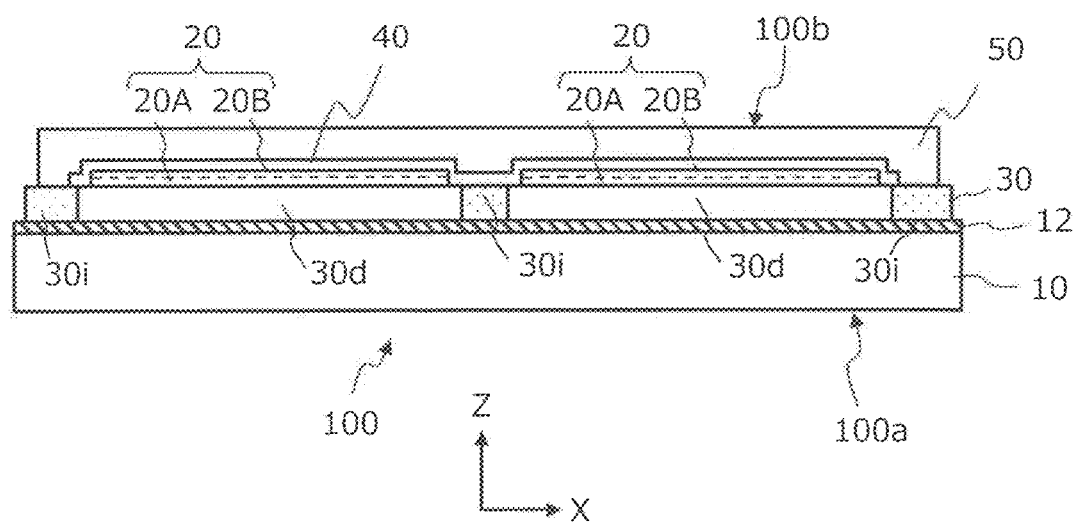
FIG. 1B is a cross-sectional view of the multilayer stack taken along line B-B of FIG. 1A.

See FIG. 1A and FIG. 1B. In a flexible OLED device production method of the present embodiment, firstly, a multilayer stack 100 illustrated in FIG. 1A and FIG. 1B is provided. FIG. 1A is a plan view of the multilayer stack 100. FIG. 1B is a cross-sectional view of the multilayer stack 100 taken along line B-B of FIG. 1A. In FIG. 1A and FIG. 1B, an XYZ coordinate system with X-axis, Y-axis and Z-axis, which are perpendicular to one another, is shown for reference.

The multilayer stack 100 of the present embodiment includes a base (motherboard or carrier) 10, functional layer regions 20 including a TFT layer 20A and an OLED layer 20B, a flexible film 30 provided between the base 10 and the functional layer regions 20 such that the flexible film 30 supports the functional layer regions 20, and a release layer 12 provided between the flexible film 30 and the base 10 and bound to the base 10. The release layer 12 is made of polycrystals of tantalum nitride. Preferably, the molar fraction of nitrogen contained in the tantalum nitride is higher than the molar fraction of tantalum contained in the tantalum nitride.

The multilayer stack 100 further includes a protection sheet 50 covering the plurality of functional layer regions 20 and a gas barrier film 40 provided between the plurality of functional layer regions 20 and the protection sheet 50 so as to cover the entirety of the functional layer regions 20. The multilayer stack 100 may include another unshown layer, such as a buffer layer.

A typical example of the base 10 is a glass base which has rigidity. A typical example of the flexible film 30 is a synthetic resin film which has flexibility. Hereinafter, the "flexible film" is simply referred to as "plastic film". A structure which includes the release layer 12 and the base 10 supporting the release layer 12, as a whole, is referred to as a "supporting substrate" of a flexible OLED device. The supporting substrate may further include another film (e.g., flexible film) which covers the release layer 12.

In the present embodiment, the first surface 100a of the multilayer stack 100 is defined by the base 10. The second surface 100b of the multilayer stack 100 is defined by the protection sheet 50. The base 10 and the protection sheet 50 are materials temporarily used in the production process but are not constituents of a final flexible OLED device.

The plastic film 30 shown in the drawings includes a plurality of flexible substrate regions 30d respectively supporting the plurality of functional layer regions 20, and an intermediate region 30i surrounding each of the flexible substrate regions 30d. The flexible substrate regions 30d and the intermediate region 30i are merely different portions of a single continuous plastic film 30 and do not need to be physically distinguished. In other words, regions of the plastic film 30 lying immediately under respective ones of the functional layer regions 20 are the flexible substrate regions 30d, and the other region of the plastic film 30 is the intermediate region 30i.

Each of the plurality of functional layer regions 20 is a constituent of a final flexible OLED device. In other words, the multilayer stack 100 has such a structure that a plurality of flexible OLED devices which are not yet divided from one another are supported by a single base 10. Each of the functional layer regions 20 has such a shape that, for example, the thickness (size in Z-axis direction) is several tens of micrometers, the length (size in X-axis direction) is about 12 cm, and the width (size in Y-axis direction) is about 7 cm. These sizes can be set to arbitrary values according to the required largeness of the display screen. The shape in the XY plane of each of the functional layer regions 20 is rectangular in the example illustrated in the drawings but is not limited to this example. The shape in the XY plane of each of the functional layer regions 20 may include a square, a polygon, or a shape which includes a curve in the contour.

As shown in FIG. 1A, the flexible substrate regions 30d are two-dimensionally arrayed in rows and columns according to the arrangement of the flexible OLED devices. The intermediate region 30i consists of a plurality of stripes perpendicular to one another and forms a grid pattern. The width of the stripes is, for example, about 1-4 mm. The flexible substrate region 30d of the plastic film 30 functions as the "flexible substrate" in each flexible OLED device which is in the form of a final product. Meanwhile, the intermediate region 30i of the plastic film 30 is not a constituent of the final product.

In an embodiment of the present disclosure, the configuration of the multilayer stack 100 is not limited to the example illustrated in the drawings. The number of functional layer regions 20 (the number of OLED devices) supported by a single base 10 does not need to be plural but may be singular. When the number of functional layer regions 20 is singular, the intermediate region 30i of the plastic film 30 forms a simple frame pattern which surrounds a single functional layer region 20.

The size or proportion of each component illustrated in respective drawings is determined from the viewpoint of under standability. The actual size or proportion is not necessarily reflected in the drawings.

Supporting Substrate

Figure 2A:
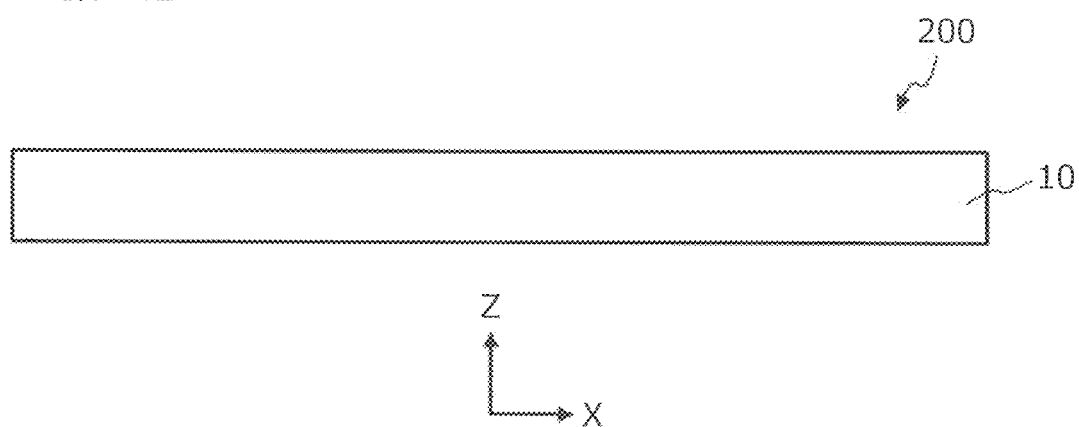
FIG. 2A is a cross-sectional view illustrating a step of a supporting substrate production method in an embodiment of the present disclosure.
Figure 2B:
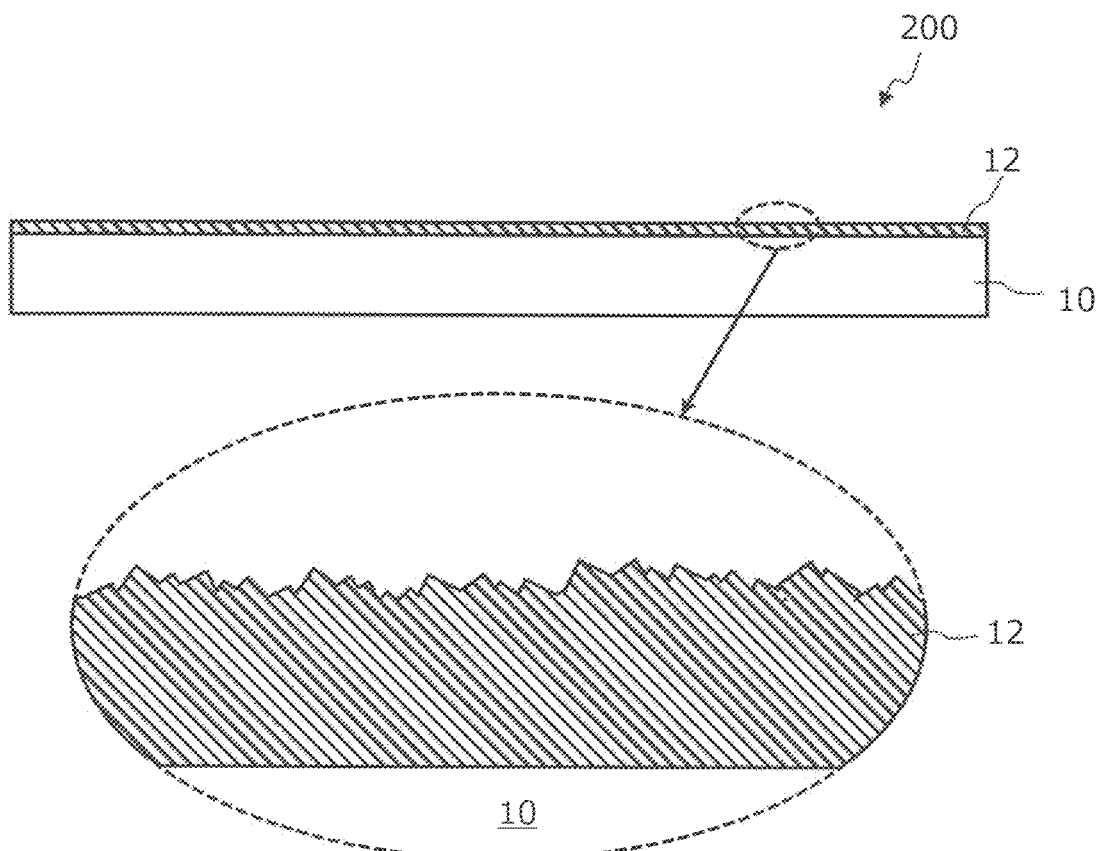
FIG. 2B is a cross-sectional view illustrating a step of the supporting substrate production method in an embodiment of the present disclosure.

A supporting substrate production method of an embodiment of the present disclosure is described with reference to FIG. 2A and FIG. 2B. FIG. 2A and FIG. 2B are cross-sectional views illustrating steps of a method for producing a supporting substrate 200 in an embodiment of the present disclosure.

Firstly, a base 10 is provided as shown in FIG. 2A. The base 10 is a carrier substrate for the process. The thickness of the base 10 is, for example, about 0.3-0.7 mm. The base 10 is typically made of glass. The base 10 is required to be capable of transmitting lift-off light which is to be applied at subsequent steps.

Then, a release layer 12 is formed on the base 10 as shown in FIG. 2B. The release layer 12 is made of polycrystals of tantalum nitride. The tantalum nitride can include various phases which have different composition ratios. When the ratio between tantalum atoms and nitrogen atoms is 1:1, a stable phase of tantalum nitride can be formed. This stable phase is a crystal which has a CoSn type structure when it is in a standard condition. The crystalline structure of the stable phase is hexagonal but is not close-packed. It is an interstitial intermetallic compound (solid solution or alloy) where a nitrogen atom is present between a tantalum atom and another tantalum atom. Tantalum nitride is likely to form a compound of a non-stoichiometric composition resulting from deficiency or excess of nitrogen atoms. In depositing a thin film of tantalum nitride, a nitrogen-rich film can be formed by excessively supplying a nitrogen gas. In an embodiment of the present disclosure, the release layer 12 is formed of a nitrogen-rich tantalum nitride (TaN$_x$: $1<x\leq2.5$).

The nitrogen-rich tantalum nitride is excellent in thermal conductivity. Therefore, if heat is produced by irradiation with lift-off light and non-uniformity occurs in the spatial distribution of the intensity of the lift-off light, delamination failure is unlikely to occur. More specifically, if there is dust attached to the rear surface of the base 10 or there are scars formed in the rear surface of the base 10, lift-off light coming into the release layer 12 from the rear surface of the base 10 undergoes diffraction or reflection due to the shadow of the dust or the scars, and there is a probability that the lift-off light intensity on the release layer 12 will locally decrease. When delamination of the plastic film 30 is realized by a photochemical reaction, such local insufficiency of the lift-off light intensity can cause unsuccessful delamination at that location, and a problem of delamination failure arises.

However, the release layer 12 of the present embodiment absorbs lift-off light and produces and transmits heat and, therefore, can avoid the above-described problem that is attributed to local insufficiency of the lift-off light intensity.

Tantalum nitride can be deposited by, for example, reactive sputtering. The reactive sputtering can be carried out by sputtering a tantalum target into a nitrogen-containing atmosphere gas. The nitrogen-containing atmosphere gas is a mixture of, for example, a nitrogen gas and an inert gas such as argon. When the mass flow rate of this mixture gas is 125 sccm, the mass flow rate of the nitrogen gas can be, for example, 100-115 sccm and the mass flow rate of the argon gas can be, for example, 15-25 sccm. It is not necessary to heat the base 10 during the sputtering. Such sputtering realizes formation of the release layer 12 at a lower cost than chemical vapor deposition. When tantalum nitride is deposited by reactive sputtering, the residual internal stress in a deposited film of tantalum nitride can be reduced by adjusting the mass flow rate of the gas or the substrate temperature. In general, a relatively large residual internal stress is likely to occur in a deposited film of a refractory metal. When the residual internal stress of the release layer is large, the supporting substrate has warpage, and there is a probability that the delamination process cannot be appropriately carried out. When the release layer is made of tantalum nitride, the supporting substrate has reduced warpage, and the delamination can be carried out at a higher yield, as compared with a case where the release layer is made of a refractory metal.

As shown in the area enclosed by broken line in FIG. 2B, the deposited film (release layer 12) of nitrogen-rich tantalum nitride has irregularities in the surface (a textured surface). The pattern of the irregularities can have such a shape and size that, for example, visible light is diffuse-reflected by the irregularities (several tens of nanometers to several hundreds of nanometers). The thickness of the release layer 12 that is made of tantalum nitride can be not less than 50 nm and not more than 500 nm, for example, about 200 nm. If the thickness of the release layer 12 is less than 50 nm, the film thickness required for the release layer to carry out its function is sometimes not locally attained in the plane of the supporting substrate due to surface irregularities or variation in film formation rate. If the thickness of the release layer 12 is more than 500 nm, the influence of the stress is nonnegligible. Note that, from the viewpoint of keeping the consumption of tantalum target as small as possible, it is more preferred that the thickness of the release layer 12 is not more than 250 nm. Nitrogen-rich tantalum nitride has no metallic luster and appears black or brown in color when observed. Nitrogen-rich tantalum nitride has such a characteristic that it absorbs at least part of visible light and ultraviolet light. In this point, tantalum nitride is much different from refractory metals which exhibit metallic luster such as molybdenum (Mo). Also, nitrogen-rich tantalum nitride can trap oxygen to be oxidized and therefore can function as a barrier layer against an oxygen gas diffused from the outside and bring about an encapsulation effect.

In the embodiment, of the present disclosure, the release layer 12 further has irregularities in the surface in addition to the above-described features and therefore efficiently absorbs ultraviolet laser light. Thus, in the lift-off light irradiation step which will be described later, termination of laser light against reflection of lift-off light is not necessary.

Hereinafter, the configuration and production method of the multilayer stack 100 are described in more detail.

Figure 3A:
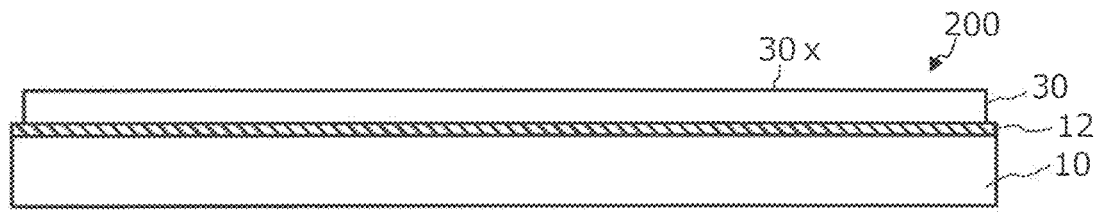
FIG. 3A is a cross-sectional view illustrating a step of a flexible OLED device production method in an embodiment of the present disclosure.

Firstly, see FIG. 3A. FIG. 3A is a cross-sectional view showing a supporting substrate 200 which includes a plastic film 30 at its surface.

In the present embodiment, the plastic film 30 is a polyimide film having a thickness of, for example, not less than 5 μm and not more than 20 μm, for example a thickness of about 10 μm. The polyimide film can be formed from a polyamide acid, which is a precursor of polyimide, or a polyimide solution. The polyimide film may be formed by forming a polyamide acid film on the surface of the release layer 12 of the supporting substrate 200 and then thermally imidizing the polyamide acid film. Alternatively, the polyimide film may be formed by forming, on the surface of the release layer 12, a film from a polyimide solution which is prepared by melting a polyimide or dissolving a polyimide in an organic solvent. The polyimide solution can be obtained by dissolving a known polyamide in an arbitrary organic solvent. The polyimide solution is applied to the surface of the base 10 and then dried, whereby a polyimide film can be formed.

In the case of a bottom emission type flexible display, it is preferred that the polyimide film realizes high transmittance over the entire range of visible light. The transparency of the polyimide film can be represented by, for example, the total light transmittance in accordance with JIS K7105-1981. The total light transmittance can be set to not less than 30% or not less than 85%. On the other hand, in the case of a top emission type flexible display, it is not affected by the transmittance.

The plastic film 30 may be a film which is made of a synthetic resin other than polyimide. Note that, however, in the embodiment of the present disclosure, the process of forming a thin film transistor includes a heat treatment at, for example, not less than 350° C., and therefore, the plastic film 30 is made of a material which will not be deteriorated by this heat treatment.

The plastic film 30 may be a multilayer structure including a plurality of synthetic resin films. In one form of the present embodiment, in delaminating a flexible display structure from the base 10, LLO is carried out such that the plastic film 30 is irradiated with ultraviolet laser light (wavelength: 300-360 nm) transmitted through the base 10. Since the release layer 12 that absorbs the laser light and produces heat is provided between the base 10 and the plastic film 30, part of the plastic film 30 (layered part) is gasified by the irradiation with the ultraviolet laser light at the interface between the release layer 12 and the plastic film 30, so that the plastic film 30 can readily be delaminated from the release layer 12, i.e., from the supporting substrate 200. Providing the release layer 12 also achieves the effect of suppressing generation of ashes.

Since in the embodiment of the present disclosure the release layer 12 is made of tantalum nitride that is black or brown in color and further has irregularities in the surface, the transmittance of the release layer 12 for ultraviolet laser light is extremely low. Thus, in the lift off (Laser Lift Off: LLO) step, the release layer 12 functions as an ultraviolet light shielding layer. As a result, entry of ultraviolet laser light from the base 10 into the functional layer regions 20, which would deteriorate the characteristics of the TFT layer 20A and the OLED layer 20B, is avoided or suppressed.

It has generally been believed that even if the transparency of the plastic film 30 is high, the plastic film 30 absorbs almost all of ultraviolet light. However, the plastic film 30 used in the flexible OLED device is an extremely thin layer and, therefore, if the release layer 12 that is made of a metal material is absent, ultraviolet laser light reaches the functional layer regions 20. Ultraviolet laser light can deteriorate not only the characteristics of the TFT layer 20A and the OLED layer 20B but also the encapsulation performance of the organic film and the inorganic film which are constituents of the encapsulation structure. Furthermore, since a plastic film 30 which is presently used in a wide variety of applications is made of a polyimide material which is yellowish brown or reddish brown in color, it has not been recognized that transmission of ultraviolet laser light can deteriorate the characteristics of the functional layer regions. This is because such a polyimide material of low transparency strongly absorbs ultraviolet laser light. However, according to research by the present inventors, even if the plastic film 30 has low transparency, ultraviolet laser light can reach the functional layer regions 20 so long as the thickness of the plastic film 30 is, for example, only about 5-20 μm. Thus, the method of the embodiment of the present disclosure is suitably used not only for production of an OLED device which includes a plastic film (flexible substrate) which is made of a material which has high transparency and which is likely to transmit ultraviolet light but also for production of an OLED device which Includes a plastic film 30 which has low transparency and which has a small thickness (thickness: about 5-20 μm).

<Polishing>

When there is an object (target) which is to be polished away, such as particles or protuberances, on the surface 30x of the plastic film 30, the target may be polished away using a polisher such that the surface becomes flat. Detection of a foreign object, such as particles, can be realized by, for example, processing of an image obtained by an image sensor. After the polishing process, a planarization process may be performed on the surface 30x of the plastic film 30. The planarization process includes the step of forming a film which improves the flatness (planarization film) on the surface 30x of the plastic film 30. The planarization film does not need to be made of a resin.

<Lower Gas Barrier Film>

Then, a gas barrier film (not shown) may be formed on the plastic film 30. The gas barrier film can have various structures. Examples of the gas barrier film include a silicon oxide film and/or a silicon nitride film. Other examples of the gas barrier film can include a multilayer film including an organic material layer and an inorganic material layer. This gas barrier film may be referred to as "lower gas barrier film" so as to be distinguishable from a gas barrier film covering the functional layer regions 20, which will be described later. The gas barrier film covering the functional layer regions 20 can be referred to as "upper gas barrier film".

<Functional Layer Region>

Next, the process of forming the functional layer regions 20, including the TFT layer 20A and the OLED layer 20B, and the upper gas barrier film 40 is described.

Figure 3B:
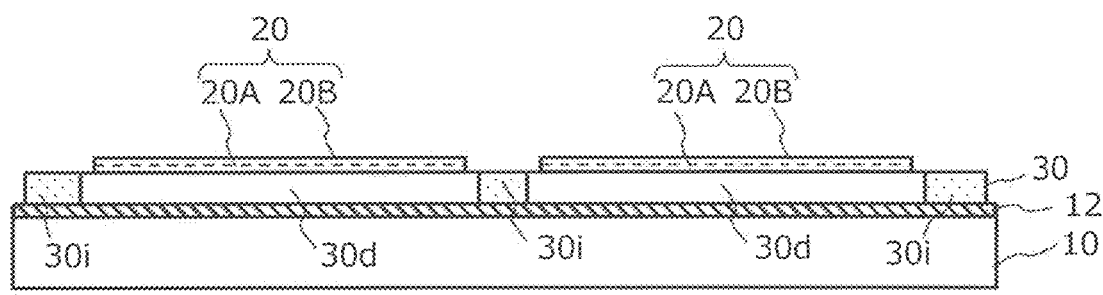
FIG. 3B is a cross-sectional view illustrating a step of the flexible OLED device production method in an embodiment of the present disclosure.

First, as shown in FIG. 3B, a plurality of functional layer regions 20 are formed on a base 10. There are a release layer 12 and a plastic film 30 between the base 10 and the functional layer regions 20. The release layer 12 and the plastic film 30 are bound to the base 10.

More specifically, the functional layer regions 20 include a TFT layer 20A (lower layer) and an OLED layer 20B (upper layer). The TFT layer 20A and the OLED layer 20B are sequentially formed by a known method. The TFT layer 20A includes a circuit of a TFT array which realizes an active matrix. The OLED layer 20B includes an array of OLED elements, each of which can be driven independently. The thickness of the TFT layer 20A is, for example, 4 μm. The thickness of the OLED layer 20B is, for example, 1 μm.

Figure 4:
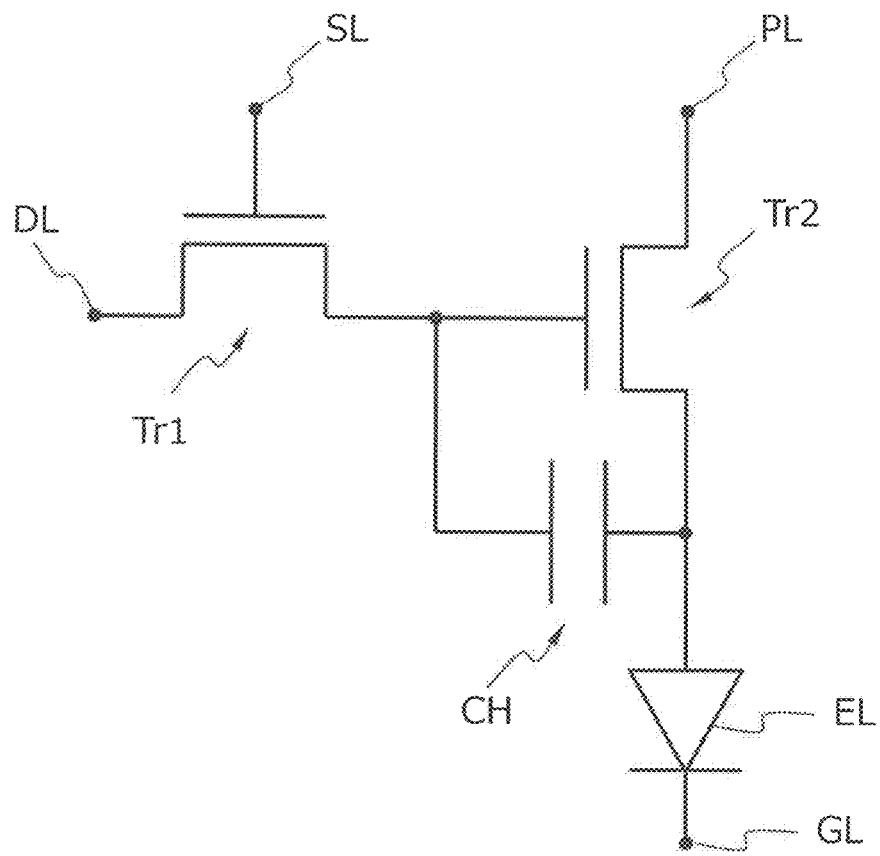
FIG. 4 is an equivalent circuit diagram of a single sub-pixel in a flexible OLED device.

FIG. 4 is a basic equivalent circuit diagram of a sub-pixel in an organic EL (Electro Luminescence) display. A single pixel of the display can consist of sub-pixels of different colors such as, for example, R (red), G (green), and B (blue). The example illustrated in FIG. 4 includes a selection TFT element Tr1, a driving TFT element Tr2, a storage capacitor CH, and an OLED element EL. The selection TFT element Tr1 is connected with a data line DL and a selection line SL. The data line DL is a line for transmitting data signals which define an image to be displayed. The data line DL is electrically coupled with the gate of the driving TFT element Tr2 via the selection TFT element Tr1. The selection line SL is a line for transmitting signals for controlling the ON/OFF state of the selection TFT element Tr1. The driving TFT element Tr2 controls the state of the electrical connection between a power line PL and the OLED element EL. When the driving TFT element Tr2 is ON, an electric current flows from the power line PL to a ground line GL via the OLED element EL. This electric current allows the OLED element EL to emit light. Even when the selection TFT element Tr1 is OFF, the storage capacitor CH maintains the ON state of the driving TFT element Tr2.

The TFT layer 20A includes a selection TFT element Tr1, a driving TFT element Tr2, a data line DL, and a selection line SL. The OLED layer 20b includes an OLED element EL. Before formation of the OLED layer 20B, the upper surface of the TFT layer 20A is planarized by an interlayer insulating film that covers the TFT array and various wires. A structure which supports the OLED layer 20B and which realizes active matrix driving of the OLED layer 20B is referred to as "backplane".

The circuit elements and part of the lines shown in FIG. 4 can be included in any of the TFT layer 20A and the OLED layer 20B. The lines shown in FIG. 4 are connected with an unshown driver circuit.

In the embodiment of the present disclosure, the TFT layer 20A and the OLED layer 20B can have various specific configurations. These configurations do not limit the present disclosure. The TFT element included in the TFT layer 20A may have a bottom gate type configuration or may have a top gate type configuration. Emission by the OLED element included in the OLED layer 20b may be of a bottom emission type or may be of a top emission type. The specific configuration of the OLED element is also arbitrary.

The material of a semiconductor layer which is a constituent of the TFT element includes, for example, crystalline silicon, amorphous silicon, and oxide semiconductor. In the embodiment of the present disclosure, part of the process of forming the TFT layer 20A includes a heat treatment step at 350° C. or higher for the purpose of improving the performance of the TFT element.

<Upper Gas Barrier Film>

Figure 3C:
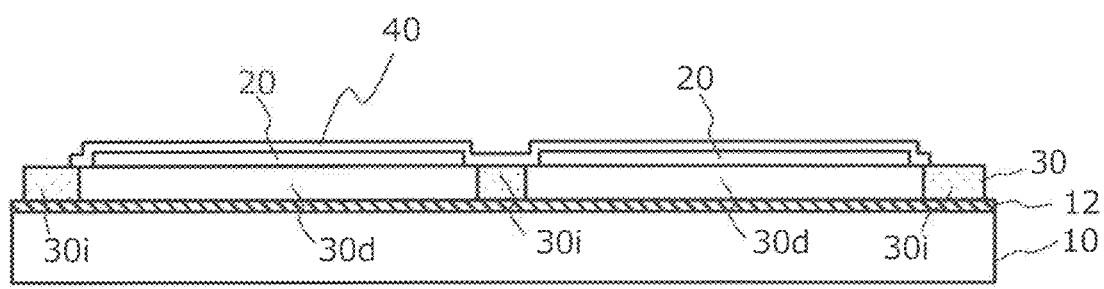
FIG. 3C is a cross-sectional view illustrating a step of the flexible OLED device production method in an embodiment of the present disclosure.

After formation of the above-described functional layer regions 20, the entirety of the functional layer regions 20 is covered with a gas barrier film (upper gas barrier film) 40 as shown in FIG. 3C. A typical example of the upper gas barrier film 40 is a multilayer film including an inorganic material layer and an organic material layer. Elements such as an adhesive film, another functional layer which is a constituent of a touchscreen, polarizers, etc., may be provided between the upper gas barrier film 40 and the functional layer regions 20 or in a layer overlying the upper gas barrier film 40. Formation of the upper gas barrier film 40 can be realized by a Thin Film Encapsulation (TFE) technique. From the viewpoint of encapsulation reliability, the WVTR (Water Vapor Transmission Rate) of a thin film encapsulation structure is typically required to be not more than $1\times10^{-4}$ $g/m^2/day$. According to the embodiment of the present disclosure, this criterion is met. The thickness of the upper gas barrier film 40 is, for example, not more than 1.5 μm.

Figure 5:
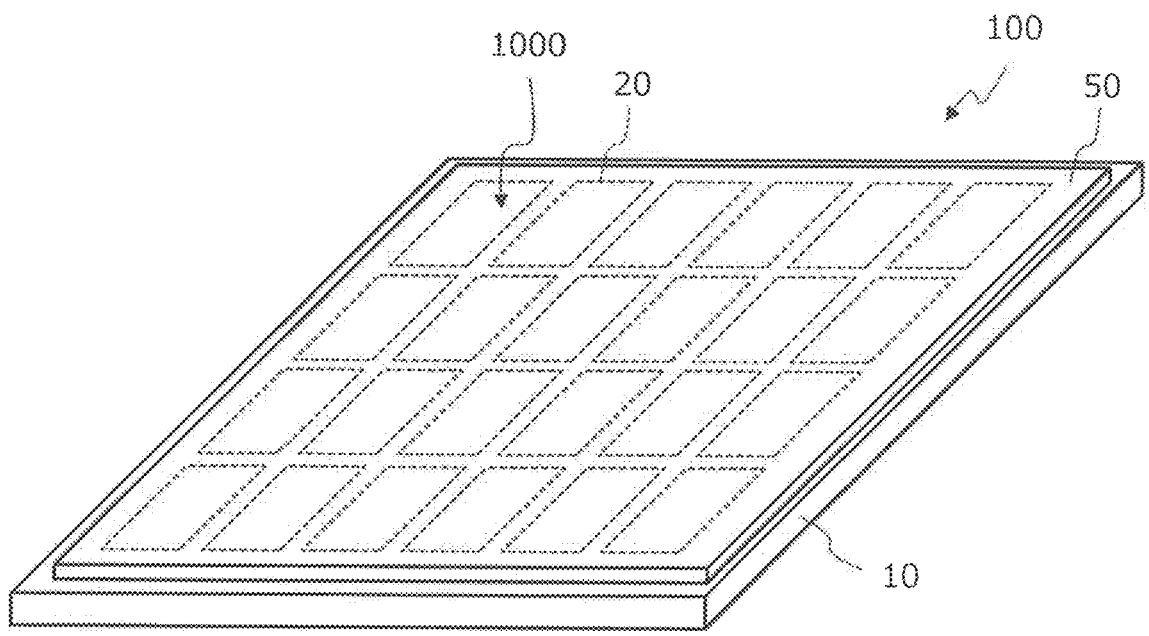
FIG. 5 is a perspective view of the multilayer stack in the middle of the production process.

FIG. 5 is a perspective view schematically showing the upper surface side of the multilayer stack 100 at a point in time when the upper gas barrier film 40 is formed. A single multilayer stack 100 includes a plurality of OLED devices 1000 supported by the base 10. In the example illustrated in FIG. 5, a single multilayer stack 100 includes a larger number of functional layer regions 20 than in the example illustrated in FIG. 1A. As previously described, the number of functional layer regions 20 supported by a single base 10 is arbitrary.

<Protection Sheet>

Figure 3D:
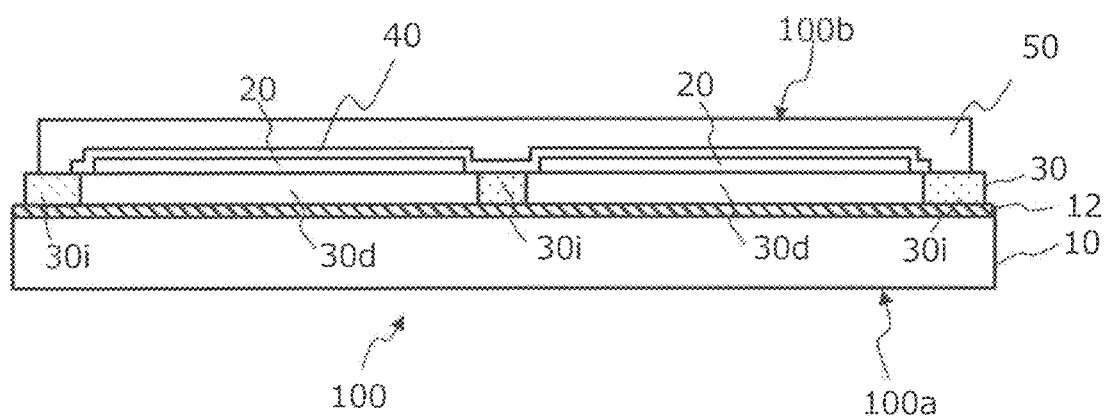
FIG. 3D is a cross-sectional view illustrating a step of the flexible OLED device product tort method in an embodiment of the present disclosure.

Next, refer to FIG. 3D. As shown in FIG. 3D, a protection sheet 50 is adhered to the upper surface of the multilayer stack 100. The protection sheet 50 can be made of a material such as, for example, polyethylene terephthalate (PET), polyvinyl chloride (PVC), or the like. As previously described, a typical example of the protection sheet 50 has a laminate structure which includes a layer of an applied mold-releasing agent at the surface. The thickness of the protection sheet 50 can be, for example, not less than 50 μm and not more than 150 μm.

After the thus-formed multilayer stack 100 is provided, the production method of the present disclosure can be carried out using the above-described production apparatus (delaminating apparatus 220).

The multilayer stack 100 which can be used in the production method of the present disclosure is not limited to the example illustrated in FIG. 1A and FIG. 1B. The protection sheet 50 may cover the entirety of the plastic film 30 and extend outward beyond the plastic film 30. Alternatively, the protection sheet 50 may cover the entirety of the plastic film 30 and extend outward beyond the base 10. As will be described later, after the base 10 is separated from the multilayer stack 100, the multilayer stack 100 is a thin flexible sheet-like structure which has no rigidity. The protection sheet 50 serves to protect the functional layer regions 20 from impact and abrasion when the functional layer regions 20 collide with or come into contact with external apparatuses or Instruments in the step of delaminating the base 10 and the steps after the delaminating. Since the protection sheet 50 is peeled off from the multilayer stack 100 in the end, a typical example of the protection sheet 50 has a laminate structure which includes an adhesive layer of a relatively small adhesive force (a layer of an applied mold-releasing agent) over its surface. The more detailed description of the multilayer stack 100 will be described later.

<Dividing of OLED Devices>

In the flexible OLED device production method of the present embodiment, after the step of providing the multilayer stack 100, the step of dividing an intermediate region 30i and respective ones of a plurality of flexible substrate regions 30d of the plastic film 30 from one another is carried out. The step of dividing does not need to be carried out before the LLO step but may be carried out after the LLO step.

The dividing can be realized by cutting a central portion between adjoining OLED devices using a laser beam or dicing saw. In the present embodiment, the multilayer stack exclusive of the base 10 is cut, and the base 10 is not cut. However, the base 10 may be cut such that the multilayer stack is divided into partial multilayer structures each Including an OLED device and a base portion that supports the OLED device.

Hereinafter, the step of cutting the multilayer structure exclusive of the base 10 by irradiation with a laser beam is described. The positions of irradiation with a laser beam for cutting are along the periphery of each of the flexible substrate regions 30d.

Figure 6A:
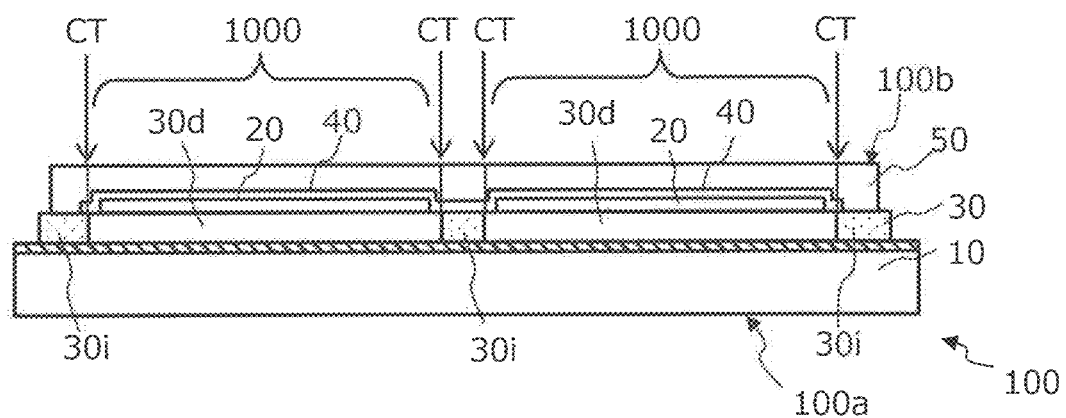
FIG. 6A is a cross-sectional view schematically showing the dividing positions in the multilayer stack.
Figure 6B:
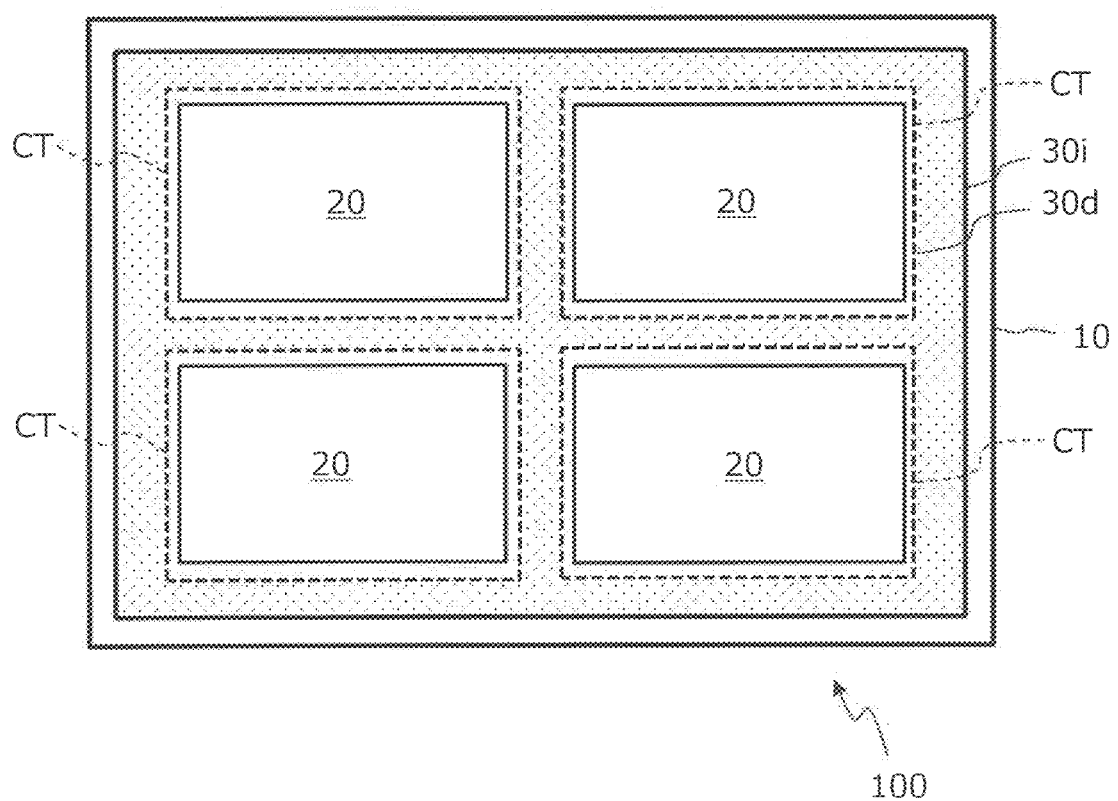
FIG. 6B is a plan view schematically showing the dividing positions in the multilayer stack.

FIG. 6A and FIG. 6B are a cross-sectional view and a plan view each schematically showing the positions at which the intermediate region 30i of the plastic film 30 and respective ones of the plurality of flexible substrate regions 30d are divided. The positions of irradiation with a laser beam for cutting are along the periphery of each of the flexible substrate regions 30d. In FIG. 6A and FIG. 6B, the irradiation positions (cut positions) CT represented by arrows or broken lines are irradiated with a laser beam for cutting, whereby the multilayer stack 100 exclusive of the base 10 is cut into the plurality of OLED devices 1000 and the remaining unnecessary portion. By the cutting, a gap of several tens of micrometers to several hundreds of micrometers is formed between each of the OLED devices 1000 and its surrounding. Such a cutting can also be realized by a dicing saw instead of laser beam irradiation as previously described. After the cutting, the OLED devices 1000 and the remaining unnecessary portion are still kept bound to the base 10.

As shown in FIG. 6B, the planar layout of the "unnecessary portion" in the multilayer stack 100 accords with the planar layout of the intermediate region 30i of the plastic film 30. In the illustrated example, the "unnecessary portion" is a single continuous sheet-like structure which has openings. However, the embodiments of the present disclosure are net limited to this example. The irradiation positions CT with the laser beam for cutting may be set such that the "unnecessary portion" is separated into a plurality of portions. Note that the sheet-like structure, which is the "unnecessary portion", includes not only the intermediate region 30i of the plastic film 30 but also cut portions of layered components on the intermediate region 30i (e.g., the gas barrier film 40 and the protection sheet 50).

When the cutting is realized by a laser beam, the wavelength of the laser beam may be in any of the infrared, visible and ultraviolet bands. From the viewpoint of reducing the effect of the cutting on the base 10, the laser beam desirably has a wavelength in the range of green to ultraviolet. For example, when a Nd:YAG laser device is used, the cutting can be carried out using a second harmonic wave (wavelength: 532 nm) or a third harmonic wave (wavelength: 343 nm or 335 nm). In such a case, the laser power is adjusted to 1 to 3 watts, and the scanning rate is set to about 500 mm per second, so chat the multilayer structure supported by the base 10 can be cut (divided) into OLED devices and unnecessary portions without damaging the base 10.

According to the embodiment of the present disclosure, the timing of the above-described cutting is earlier than in the prior art. Since the cutting is carried out while the plastic film 30 is bound to the base 10, alignment for the cutting can be made with high precision and accuracy even if the gap between adjoining OLED devices 1000 is narrow. Thus, the gap between adjoining OLED devices 1000 can be shortened, and accordingly, useless portions which are unnecessary for a final product can be reduced.

<Lift-Off Light Irradiation>

Figure 7A:
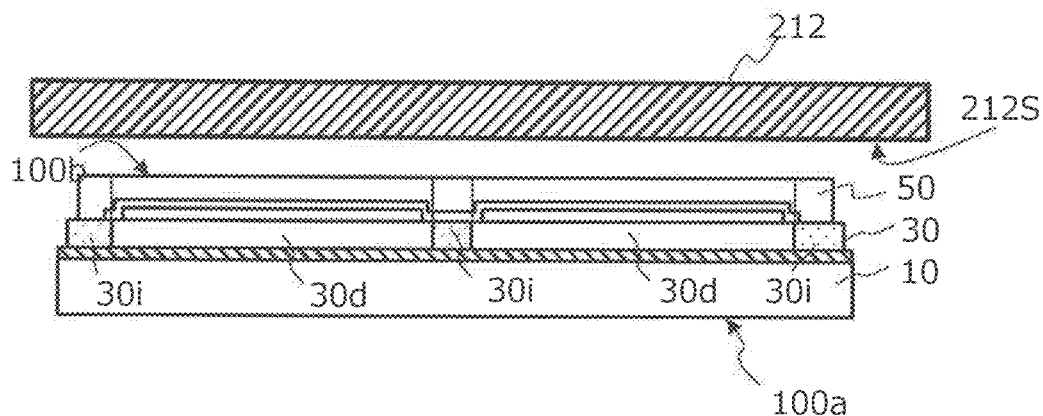
FIG. 7A is a diagram schematically showing a state immediately before a stage supports a multilayer stack.

FIG. 7A schematically shows a state in an unshown production apparatus (delaminating apparatus) immediately before the stage 212 supports the multilayer stack 100. In the present embodiment, the stage 212 is a chuck stage which has a large number of pores in the surface for suction. The configuration of the chuck stage is not limited to this example. It may include an electrostatic chuck for supporting the multilayer stack or any other fixing device. The multilayer stack 100 is arranged such that the second surface 100b of the multilayer stack 100 faces the surface 212S of the stage 212, and is in close contact with the stage 212.

Figure 7B:
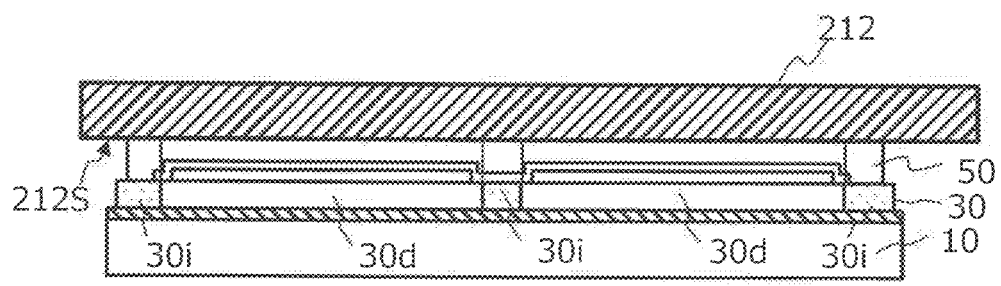
FIG. 7B is a diagram schematically showing a state where the stage supports the multilayer stack.

FIG. 7B schematically shows a state where the stage 212 supports the multilayer stack 100. The arrangement of the stage 212 and the multilayer stack 100 is not limited to the example illustrated in the drawing. For example, the multilayer stack 100 may be placed upside down such that the stage 212 is present under the multilayer stack 100.

In the example illustrated in FIG. 7B, the multilayer stack 100 is in contact with the surface 212S of the stage 212, and the stage 212 holds the multilayer stack 100 by suction.

Figure 7C:
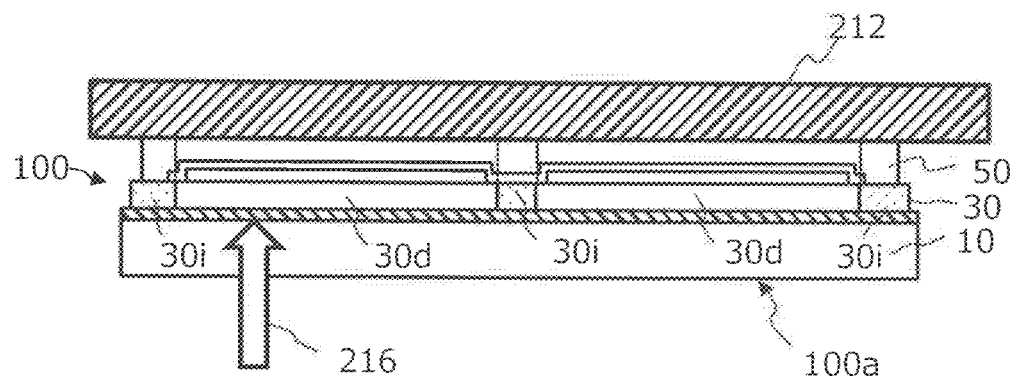
FIG. 7C is a diagram schematically showing that the interface between a base and a plastic film of the multilayer stack with laser light (lift-off light) in the shape of a line.

Then, as shown in FIG. 7C, the release layer 12 that is present between the plurality of flexible substrate regions 30d of the plastic film 30 and the base 10 is irradiated with laser light (lift-off light) 216. FIG. 7C schematically illustrates irradiation of the release layer 12 at the base 10 side with the lift-off light 216 in the shape of a line extending in a direction vertical to the sheet of the drawing. The release layer 12 absorbs ultraviolet laser light to be heated within a short time period. A part of the plastic film 30 at the interface between the release layer 12 and the plastic film 30 gasifies or decomposes (disappears) due to the heat from the release layer 12. By scanning the release layer 12 with the lift-off light 216, the degree of binding of the plastic film 30 to the release layer 12, in other words, the supporting substrate 200, is reduced. The wavelength of the lift-off light 216 is typically in the ultraviolet band. The light absorption by the base 10 is, for example, about 10% in the wavelength range of 343-355 nm but can increase to 30-60% at 308 nm.

Hereinafter, lift-off light irradiation according to the present embodiment is described in detail.

In the present embodiment, the delaminating apparatus includes a line beam source for emitting the lift-off light 216. The line beam source includes a laser device and an optical system for shaping laser light emitted from the laser device into a line beam.

Figure 8A:
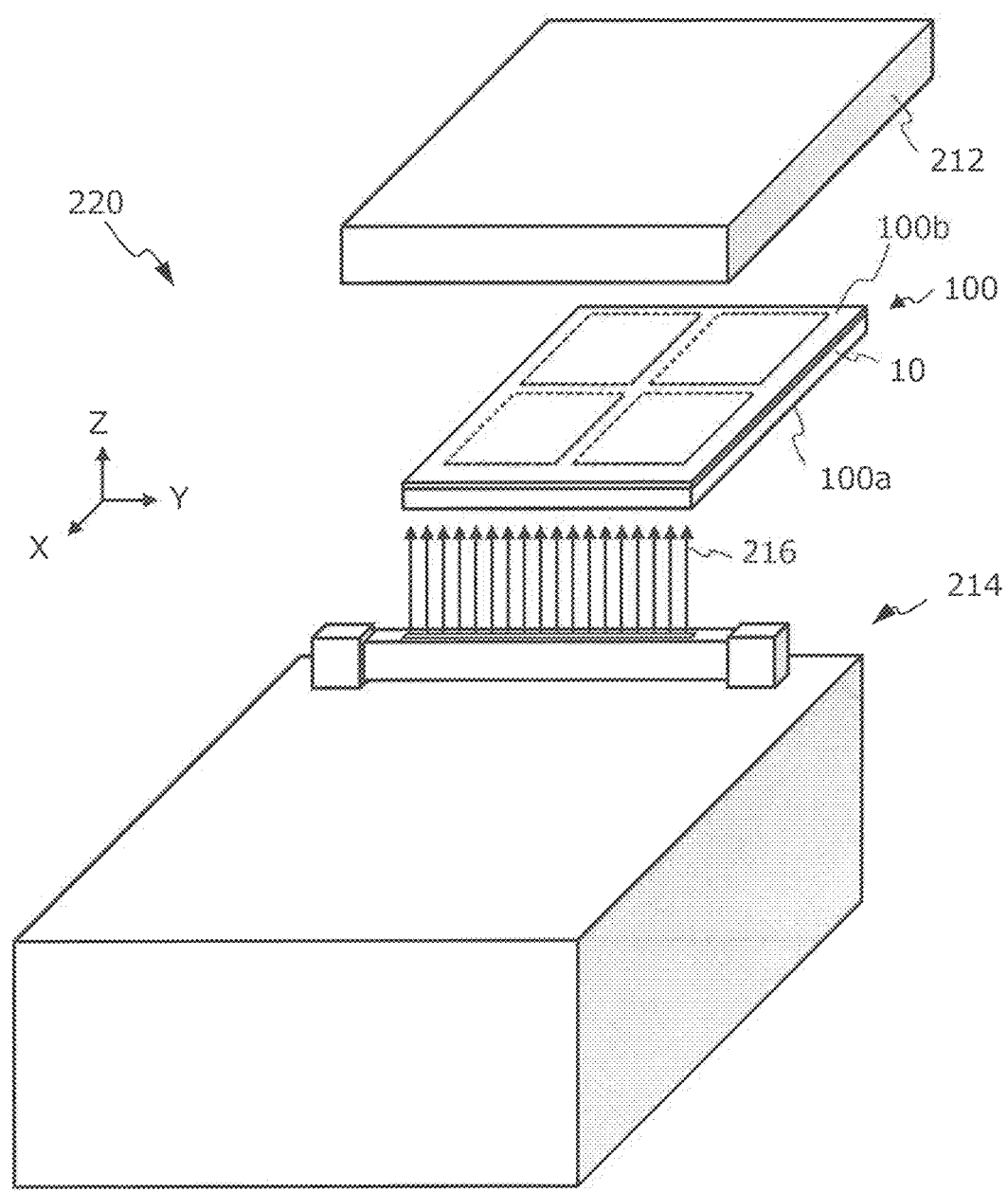
FIG. 8A is a perspective view schematically showing irradiation of the multilayer stack with a line beam emitted from a line beam source of a delaminating apparatus.

FIG. 8A is a perspective view schematically showing irradiation of the multilayer stack 100 with a line beam (lift-off light 216) emitted from a line beam source 214 of a delaminating apparatus 220. For the sake of understandability, the stage 212, the multilayer stack 100 and the line beam source 214 are shown as being spaced away from one another in the Z-axis direction of the drawing. During irradiation with the lift-off light 216, the second surface 100b of the multilayer stack 100 is in contact with the stage 212.

Figure 8B:
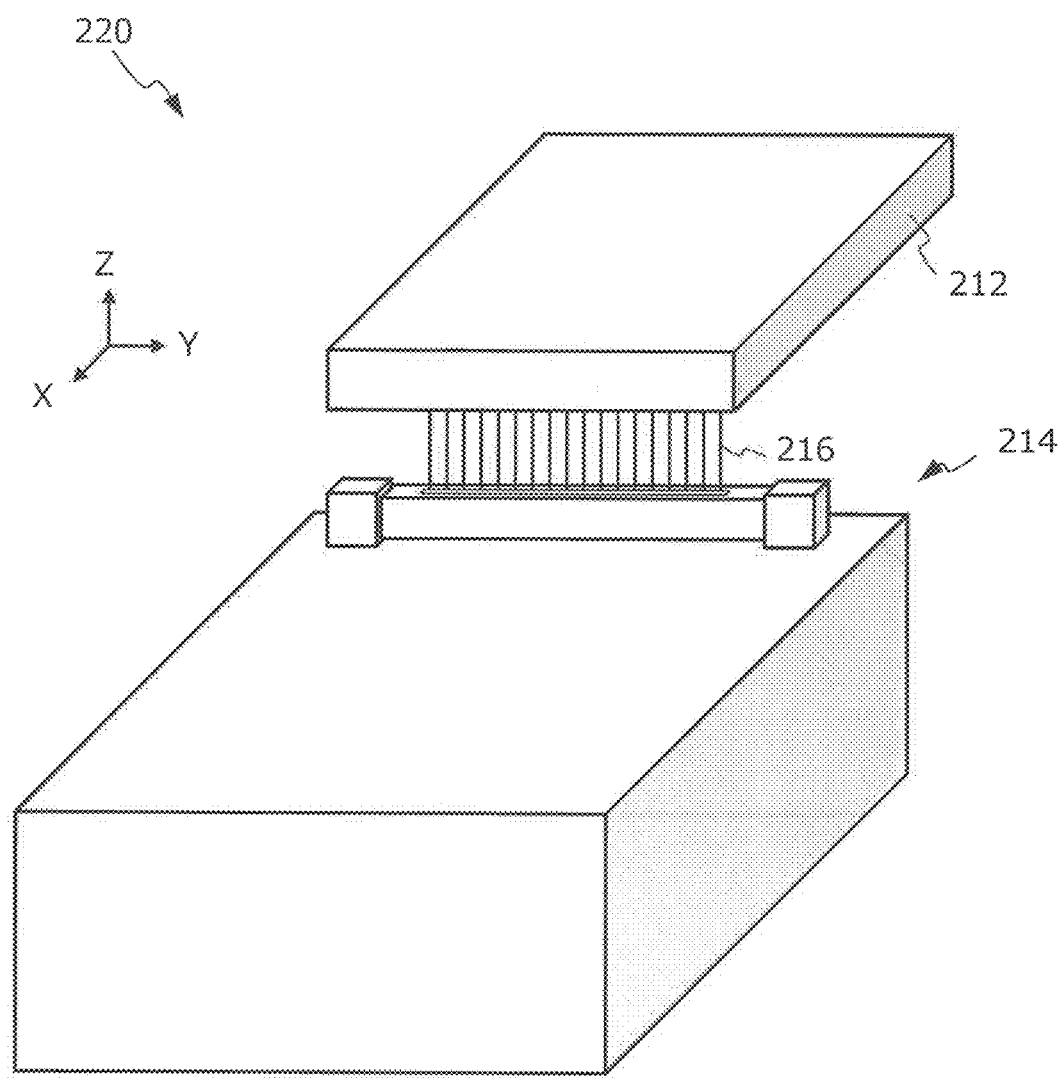
FIG. 8B is a diagram schematically showing the position of the stage at the start of irradiation with lift-off light.

FIG. 8B schematically shows the position of the stage 212 during irradiation with the lift-off light 216. Although not shown in FIG. 8B, the multilayer stack 100 is supported by the stage 212.

Examples of the layer device that emits the lift-off light 216 include gas lager devices such as excimer laser, solid laser devices such as YAG laser, semiconductor laser devices, and other types of laser devices. A XeCl excimer laser device can generate laser light at the wavelength of 308 nm. When yttrium orthovanadate ($YVO_4$) doped with neodymium (Nd) or $YVO_4$ doped with ytterbium (Yb) is used as a lasing medium, the wavelength of laser light (fundamental wave) emitted from the lasing medium is about 1000 nm. Therefore, the fundamental wave can be converted by a wavelength converter to laser light at the wavelength of 340-360 nm (third harmonic wave) before it is used.

From the viewpoint of suppressing generation of ashes, using laser light at the wavelength of 308 nm from the excimer laser device, rather than laser light at the wavelength of 340-360 nm, is more effective. Further, the presence of the release layer 12 brings about a profound effect in suppressing generation of ashes.

The irradiation with the lift-off light 216 can be carried out with the power density (irradiance) of, for example, 50-300 $mJ/cm^2$. The lift-off light 216 in the shape of a line beam has a size which can extend across the base 10, i.e., a line length which exceeds the length of one side of the base (long axis dimension, size in Y-axis direction of FIG. 8B). The line length can be, for example, not less than 750 mm. Meanwhile, the line width of the lift-off light 216 (short axis dimension, size in X-axis direction of FIG. 8B) can be, for example, about 0.2 mm. These dimensions represent the size of the irradiation region at the interface between the plastic film 30 and the base 10. The lift-off light 216 can be emitted in the form of a pulsed or continuous wave. Irradiation with the pulsed wave can be carried out at the frequency of, for example, about 200 times per seconds.

Figure 8C:
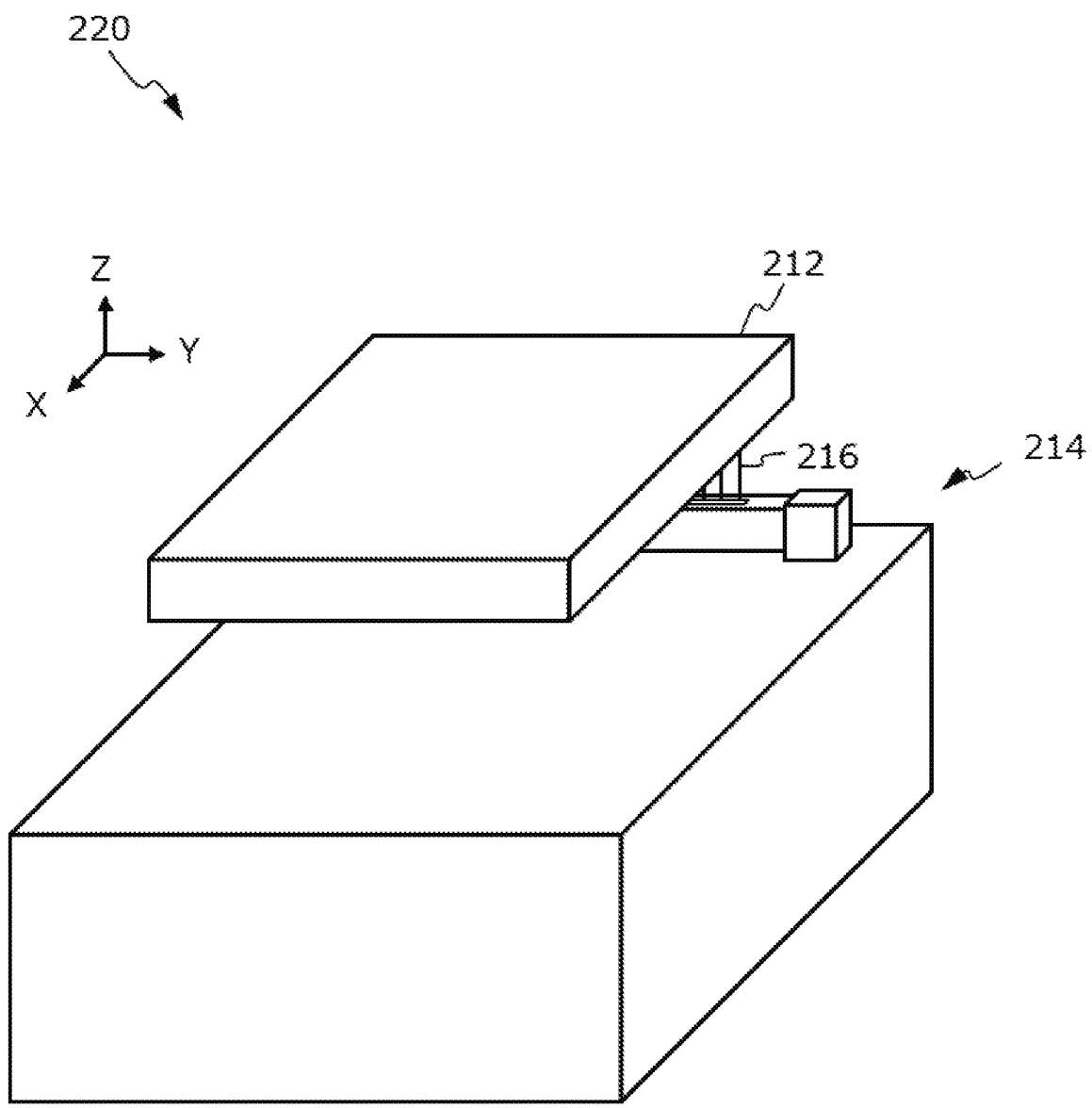
FIG. 8C is a diagram schematically showing the position of the stage at the end of irradiation with lift-off light.

The position of irradiation with the lift-off light 216 moves relative to the base 10 for scanning with the lift-off light 216. In the delaminating apparatus 220, the multilayer stack 100 may be movable while the light source 214 from which the lift-off light is to be emitted and an optical unit (not shown) are stationary, and vice versa. In the present embodiment, irradiation with the lift-off light 216 is carried out during a period where the stage 212 moves from the position shown in FIG. 8B to the position shown in FIG. 8C. That is, scanning with the lift-off light 216 is carried out by movement of the stage 212 in the X-axis direction.

In the present embodiment, the specular reflection of ultraviolet laser light by the release layer is suppressed and, therefore, termination of reflected laser light is not necessary. When the release layer is formed by a metal film which can cause specular reflection of ultraviolet laser light, ultraviolet laser light impinging on the release layer is sometimes inclined by 5-15°. In the present embodiment, such inclined irradiation is not necessary.

<Lift-Off>

Figure 9A:
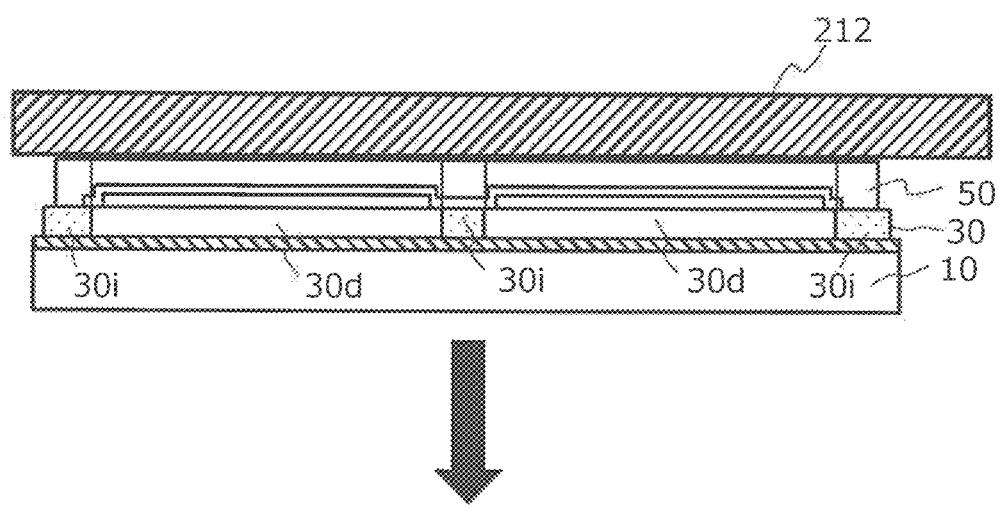
FIG. 9A is a cross-sectional view schematically showing the multilayer stack before the multilayer stack is separated into the first portion and the second portion after irradiation with lift-off light.

FIG. 9A illustrates a state where the multilayer stack 100 is in contact with the stage 212 after irradiation with the lift-off light. While this state is maintained, the distance from the stage 212 to the base 10 is increased. At this point in time, the stage 212 of the present embodiment holds an OLED device portion of the multilayer stack 100 by suction.

An unshown actuator holds the base 10 and moves the entirety of the base 10 in the direction of the arrow, thereby carrying out delaminating (lift-off). The base 10 can be moved together with an unshown chuck stage while being adhered by suction to the chuck stage. The direction of movement of the base 10 does not need to be vertical, but may be diagonal, to the first surface 100a of the multilayer stack 100. The movement of the base 10 does not need to be linear but may be rotational. Alternatively, the stage 212 may be moved upward in the drawing while the base 10 is secured by an unshown holder or another stage.

Figure 9B:
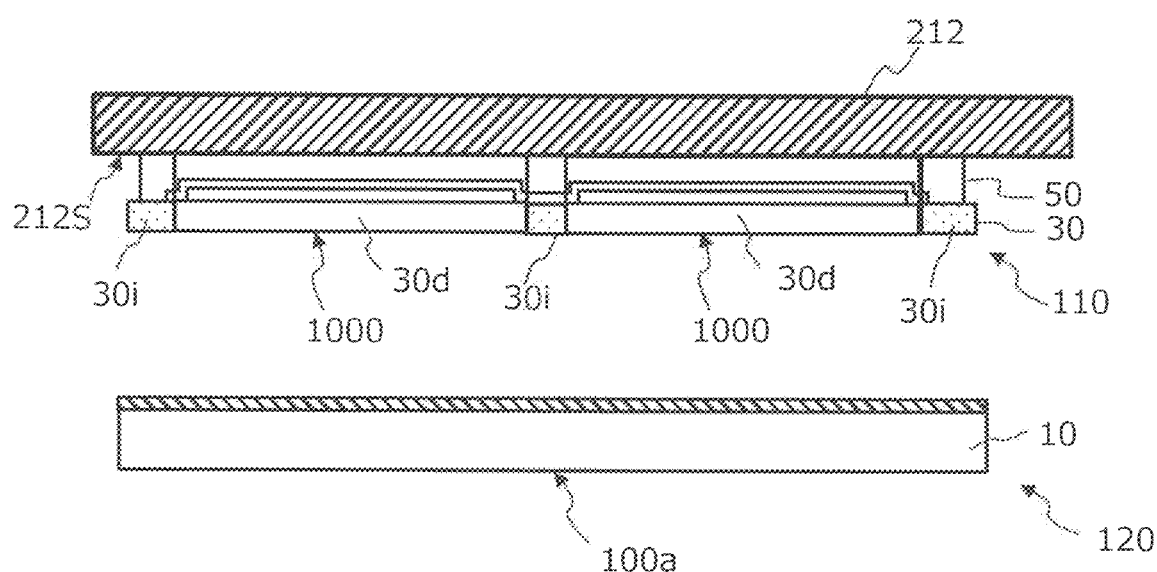
FIG. 9B is a cross-sectoral view schematically showing the multilayer stack separated info the first portion and the second portion.

FIG. 9B is a cross-sectional view showing the thus-separated first portion 110 and second portion 120 of the multilayer stack 100. The first portion 110 of the multilayer stack 100 includes a plurality of OLED devices 1000 which are in contact with the stage 212. The respective OLED devices 1000 include the functional layer regions 20 and the plurality of flexible substrate regions 30d of the plastic film 30. Meanwhile, the second portion 120 of the multilayer stack 100 includes the base 10 and the release layer 12.

Respective ones of the OLED devices 1000 supported by the stage 212 are cut off from one another and therefore can be simultaneously or sequentially separated from the stage 212 in an easy manner.

Although in the above-described embodiment respective ones of the OLED devices 1000 are cut away before the LLO step, respective ones of the OLED devices 1000 may be cut away after the LLO step. Cutting away respective ones of the OLED devices 1000 may include dividing the base 10 into corresponding portions.

Figure 10:
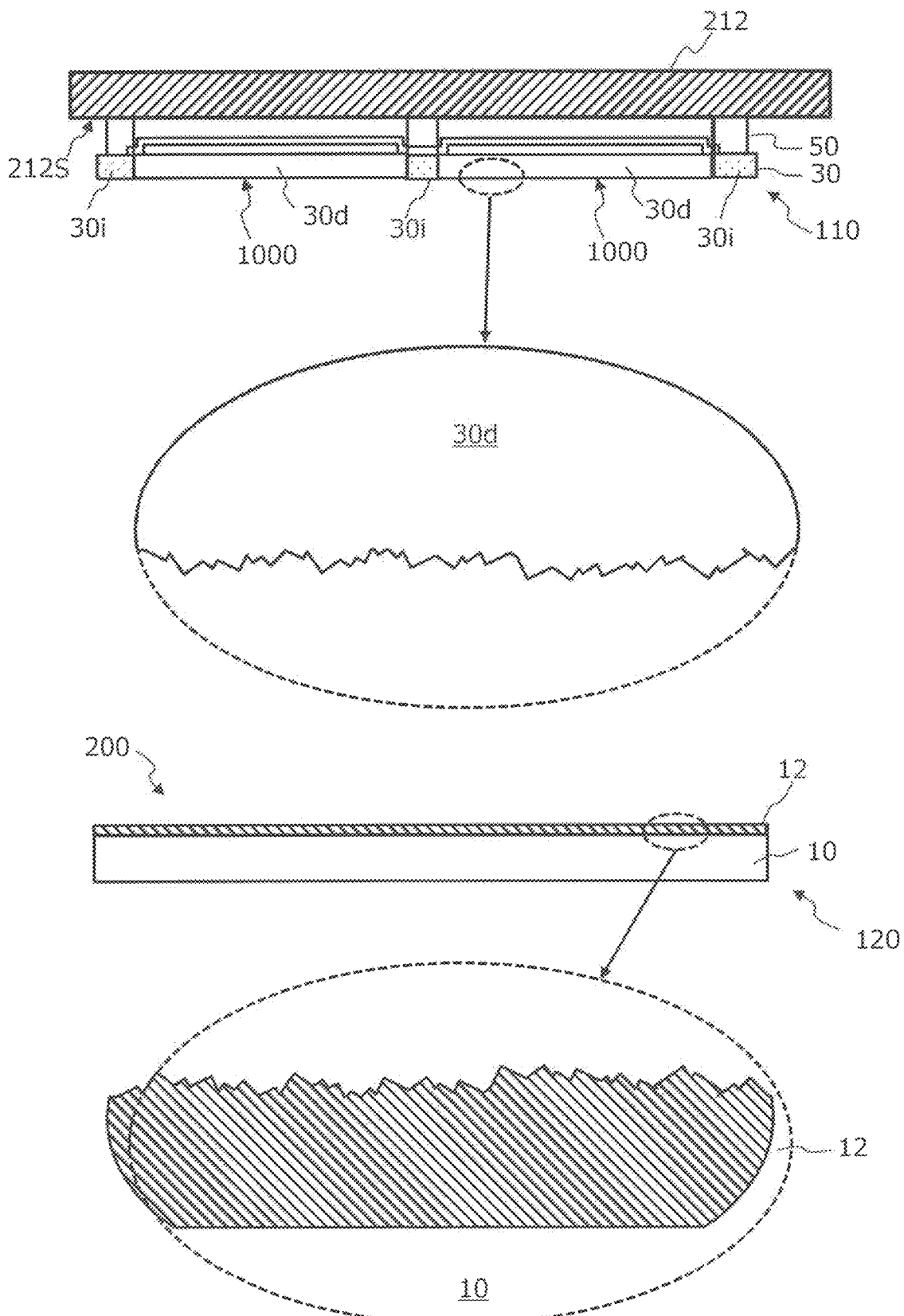
FIG. 10 is a cross-sectional view schematically showing irregularities at the rear surface of a flexible substrate of an OLED device 1000.

FIG. 10 is a cross-sectional view schematically showing irregularities at the rear surface of a flexible substrate region 30d of an OLED device 1000. The rear surface of the plastic film (flexible film) 30 has irregularities which are in accordance with the irregularity pattern at the surface of the release layer 12. The irregularities have such a shape and size that visible light is diffuse-reflected by the irregularities. The OLED device 1000 may further include a support film adhered to the rear surface of the flexible substrate region 30d. When the plastic film 30 has a thickness of, for example, about 5-20 μm, adhesion of the support film can be carried out. The presence of the irregularities at the rear surface of the plastic film 30 increases the adhered area to the support film and improves the anchoring effect and, therefore, improves the adhesion strength between the flexible substrate region 30d and the support film.

According to an embodiment of the present disclosure, even when the flexible film used is made of a polyimide of high transparency which is capable of transmitting ultraviolet light and PET, or when the flexible film used has low transparency but is thin (thickness: 5-20 μm) so that it is capable of transmitting ultraviolet light, deterioration by ultraviolet light in characteristics of the functional layer region and deterioration by ultraviolet light in performance of the gas barrier layer can be suppressed.

INDUSTRIAL APPLICABILITY

An embodiment of the present invention provides a novel flexible OLED device production method. A flexible OLED device is broadly applicable to smartphones, tablet computers, on-board displays, and small-, medium- and large-sized television sets.

REFERENCE SIGNS LIST

10 . . . base, 12 . . . release layer, 20 . . . functional layer region, 20A . . . TFT layer, 20B . . . OLED layer, 30 . . .

plastic film, 30*d* . . . flexible substrate region of plastic film, 30*i* . . . intermediate region of plastic film, 40 . . . gas barrier film, 50 . . . protection sheet, 100 . . . multilayer stack, 212 . . . stage, 1000 . . . OLED device

The invention claimed is:

1. A method for producing a flexible OLED device, comprising:
    providing a multilayer stack, the multilayer stack including a base, a functional layer region which includes a TFT layer and an OLED layer, a flexible film provided between the base and the functional layer region and supporting the functional layer region, and a release layer provided between the flexible film and the base and bound to the base; and
    irradiating the release layer with ultraviolet laser light transmitted through the base, thereby delaminating the flexible film from the release layer,
    wherein the release layer is made of a polycrystal of tantalum nitride.

2. The method of claim 1, wherein a molar fraction of nitrogen contained in the tantalum nitride is higher than a molar fraction of tantalum contained in the tantalum nitride.

3. The method of claim 1, wherein
    a surface of the release layer has an irregularity pattern, and
    a rear surface of the flexible film has a pattern transferred from the irregularity pattern at the surface of the release layer.

4. The method of claim 1, wherein a thickness of the release layer is not less than 50 nm and not more than 500 nm.

5. The method of claim 1, wherein a wavelength of the ultraviolet laser light is not less than 300 nm and not more than 360 nm.

6. The method of claim 1, wherein a thickness of the flexible film is not less than 5 μm and not more than 20 μm.

7. The method of claim 1, wherein providing the multilayer stack includes
    sputtering a tantalum target in a nitrogen-containing gas atmosphere, thereby forming a polycrystal of tantalum nitride on the base, and
    forming the flexible film on the polycrystal of tantalum nitride.

* * * * *